(12) United States Patent
Sundararajan et al.

(10) Patent No.: US 7,930,662 B1
(45) Date of Patent: Apr. 19, 2011

(54) METHODS FOR AUTOMATICALLY GENERATING FAULT MITIGATION STRATEGIES FOR ELECTRONIC SYSTEM DESIGNS

(75) Inventors: Prasanna Sundararajan, San Jose, CA (US); John D. Corbett, Monte Sereno, CA (US); David W. Bennett, Silverthorne, CO (US); Jeffrey M. Mason, Eldorado Springs, CO (US)

(73) Assignee: Xilinx, Inc., San Jose, CA (US)

( * ) Notice: Subject to any disclaimer, the term of this patent is extended or adjusted under 35 U.S.C. 154(b) by 323 days.

(21) Appl. No.: 12/264,283

(22) Filed: Nov. 4, 2008

(51) Int. Cl.
*G06F 17/50* (2006.01)
(52) U.S. Cl. ............ 716/104; 716/106; 716/103; 703/16
(58) Field of Classification Search .................... 703/16; 716/2, 18, 103, 104, 106
See application file for complete search history.

(56) References Cited

U.S. PATENT DOCUMENTS

| | | | | |
|---|---|---|---|---|
| 5,703,788 | A * | 12/1997 | Shei et al. | 716/102 |
| 6,370,494 | B1 * | 4/2002 | Mizuno et al. | 703/17 |
| 6,477,683 | B1 * | 11/2002 | Killian et al. | 716/106 |
| 6,490,711 | B2 * | 12/2002 | Buckley, Jr. | 716/102 |
| 7,134,104 | B2 * | 11/2006 | Goodnow et al. | 716/103 |
| 7,278,056 | B2 * | 10/2007 | Hekmatpour | 714/37 |
| 7,315,991 | B1 | 1/2008 | Bennett | |
| 7,325,209 | B2 * | 1/2008 | Mitra et al. | 716/102 |
| 7,406,673 | B1 | 7/2008 | Patterson et al. | |
| 7,496,820 | B1 * | 2/2009 | Theron et al. | 714/738 |
| 7,730,435 | B2 * | 6/2010 | Pritchard et al. | 716/136 |
| 7,757,198 | B1 * | 7/2010 | Zhao et al. | 716/103 |
| 2003/0135832 | A1 * | 7/2003 | Buckley, Jr. | 716/5 |
| 2005/0125749 | A1 * | 6/2005 | Goodnow et al. | 716/3 |
| 2005/0229123 | A1 * | 10/2005 | Wang et al. | 716/4 |
| 2007/0083844 | A1 * | 4/2007 | Kabuo et al. | 716/18 |
| 2007/0234247 | A1 * | 10/2007 | Pritchard et al. | 716/4 |
| 2008/0016477 | A1 * | 1/2008 | Kleinosowski et al. | 716/4 |
| 2008/0127009 | A1 * | 5/2008 | Veneris et al. | 716/4 |
| 2008/0134107 | A1 * | 6/2008 | Wang et al. | 716/2 |
| 2009/0125766 | A1 * | 5/2009 | Safarpour et al. | 714/724 |

OTHER PUBLICATIONS

Pratt, Brian et al., "Fine-Grain SEU Mitigation for FPGAs Using Partial TMR," *IEEE Transactions on Nuclear Science*, Aug. 2008, pp. 2274-2280, vol. 55, No. 4.
Xilinx, Inc., *Xilinx TMRTool User Guide*, Sep. 30, 2004, 80 pp., UG156 (v1.0), available from Xilinx, Inc., San Jose, California, USA. See particularly pp. 44-49 & 51-68, 80 pages.
Xilinx, Inc., *Xilinx TMRTool User Guide*, Aug. 4, 2006, 86 pp., UG156 (v2.1), available from Xilinx, Inc., San Jose, California, USA. See particularly pp. 42-47, 49-65, & 77, 86 pages.
Xilinx, Inc., *Xilinx TMRTool User Guide*, Sep. 12, 2007, 94 pp., UG156 (v2.2), available from Xilinx, Inc., San Jose, California, USA. See particularly pp. 44-49, 51-67, & 79, 94 pages.

* cited by examiner

*Primary Examiner* — Phallaka Kik
(74) *Attorney, Agent, or Firm* — LeRoy D. Maunu; Lois D. Cartier (57) ABSTRACT

Approaches for generating a design of an electronic system are disclosed. In one approach, for each of one or more components of a first specification of the design, an error mitigation technique is selected from among multiple different error mitigation techniques in response to user-specified data associated with the first specification of the design. A second specification of the design is automatically generated from the first specification. The second specification includes error mitigation logic corresponding to each selected error mitigation technique for each of the one or more components. The second specification of the design is stored for subsequent processing.

18 Claims, 5 Drawing Sheets

METHODS FOR AUTOMATICALLY GENERATING FAULT MITIGATION STRATEGIES FOR ELECTRONIC SYSTEM DESIGNS

FIELD OF THE INVENTION

The present invention generally relates to automatically generating fault tolerance circuitry for a circuit design.

BACKGROUND

Electronic systems and circuits may experience random errors for a variety of reasons, including exposure to ionizing radiation, and poor signal integrity. As such, fault tolerant circuits may be built into the system design. Fault tolerant circuits can range from more robust error mitigation approaches such as circuit redundancies to the less robust approaches such as bit checking. As a general rule, more robust error mitigation circuitry comes at the cost of using more chip area. Balancing these trade-offs can present challenges when designing circuits.

Recent trends in circuit design include the use of high-level programming languages (HLLs) to design electronic circuits. For example, a circuit design can be specified initially as a program written in an HLL such as Fortran, C/C++, JAVA, or the like. This approach allows a developer to concentrate on an algorithmic solution to a problem rather than the specific hardware involved. A variety of different tools are available which effectively translate the HLL program into a synthesizable netlist or other software-based circuit representation. For example, tools for Compiling High Level Language into Massively Pipelined Systems (CHiMPS) provide means to compile programs written in languages such as C and Fortran into an intermediate target language, which can be further processed to implement the design in a suitable combination of hardware and software. The CHiMPS tools are described by David W. Bennett in U.S. Pat. No. 7,315,991 entitled "Compiling HLL into Massively Pipelined Systems", issued Jan. 1, 2008, which is incorporated herein by reference.

Software compilers and Hardware Description Language (HDL) compilers often employ intermediate representations of the program/hardware description being compiled to improve the modularity of the compilation process, thus making the compiler itself simpler or more flexible. The intermediate representation of a program may be expressed in terms of templates to be instantiated by inserting specific details of the program being compiled.

SUMMARY

The various embodiments of the invention provide methods for generating a design of an electronic system. In one embodiment, a method comprises selecting an error mitigation technique for each of one or more components of a first specification of the design. The error mitigation techniques are selected from among multiple different error mitigation techniques in response to user-specified data associated with the first specification of the design. The method further includes automatically generating a second specification of the design from the first specification, the second specification including error mitigation logic corresponding to each selected error mitigation technique for each of the one or more components. The second specification is then stored. In another embodiment, a processor-readable storage medium includes instructions for performing the operations described above. Yet another embodiment provides a system for performing these specified operations.

In certain embodiments, the error mitigation logic is selected from a library of error mitigation logic that includes error mitigation logic for each of the multiple different error mitigation techniques. The error mitigation logic may include one or more of triple modular redundant (TMR) logic, dual modular redundant (DMR) logic, scrubbing logic, time redundancy, and parity checking logic, for example. In certain embodiments, the first specification is provided in a high level programming language (HLL), or input via a graphical user interface (GUI). The second specification may be a circuit specification for the electronic system, or a computer program specification for executing in the electronic system, for example.

In certain embodiments, generating the second specification includes translating the first specification to a program in an intermediate programming language having a plurality of instructions. The generated second specification includes versions of the hardware modules for the selected error mitigation technique that correspond to the plurality of intermediate programming language instructions in the program. In such embodiments, the error mitigation logic may be selected from a library of error mitigation logic, the library including a respective hardware module for each different one of the instructions, and each hardware module including a respective version for each of two or more of the error mitigation techniques. The library may also include at least two respective versions of first-in-first-out (FIFO) buffer hardware modules for each of two or more of the error mitigation techniques. The generated second specification includes one of the versions of the FIFO buffer hardware modules corresponding to the selected error mitigation technique for input of operand values to and output of operand values from the instructions of the program in an intermediate programming language.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings, in which.

DETAILED DESCRIPTION

In various embodiments, the present invention may be used to generate circuit designs that are robust in the presence of random errors, for example caused by exposure of the circuit to ionizing radiation. In methods of the present invention, varying degrees of error mitigating and correcting circuits are automatically incorporated into an electronic system design, for example during the process of compiling a high level description of the design into a highly parallel implementation. The present invention is applicable for use with software programming languages or hardware description languages for implementation of the system design into integrated circuit (IC) descriptions, programmable IC configurations (e.g., for field programmable gate arrays), software programs executable in the system, and so forth.

The various embodiments of the invention provide methods for automatically selecting and generating error mitigation logic for an electronic system from a high level specification of the system design. In accordance with certain embodiments, the methods of the present invention include selecting an error mitigation technique from among multiple different error mitigation techniques for each component of the system design. The selection may be performed, for example, in response to user-specified data such as a desired level of fault tolerance. From a first specification of the system design, a second specification of the design is automatically generated to include error mitigation logic corresponding to each selected error mitigation technique for each design component. The second specification is then stored for later implementation, for example as hardware circuitry, a computer program, or some combination of hardware and software.

In certain embodiments, the first specification is provided in a high level programming language (HLL), or input via a graphical user interface (GUI). Certain embodiments of the present invention involve specifying and automatically generating error mitigation logic of varying degrees at the high level design stage for an electronic system. The error mitigation logic can be selected from a library of modules associated with different components of the design, each module including a different level of error mitigation logic for the respective component. The library may be contained within a compiler for a highly parallel target platform such as a field programmable gate array (FPGA) or other programmable IC, or a general logic circuit. In accordance with certain embodiments, a processor-executable tool may be used to automatically insert error mitigation of varying degrees in response to user-specified information and during compilation targeting highly parallel programmable logic such as FPGAs or to general circuit or software synthesis.

Figure 1:
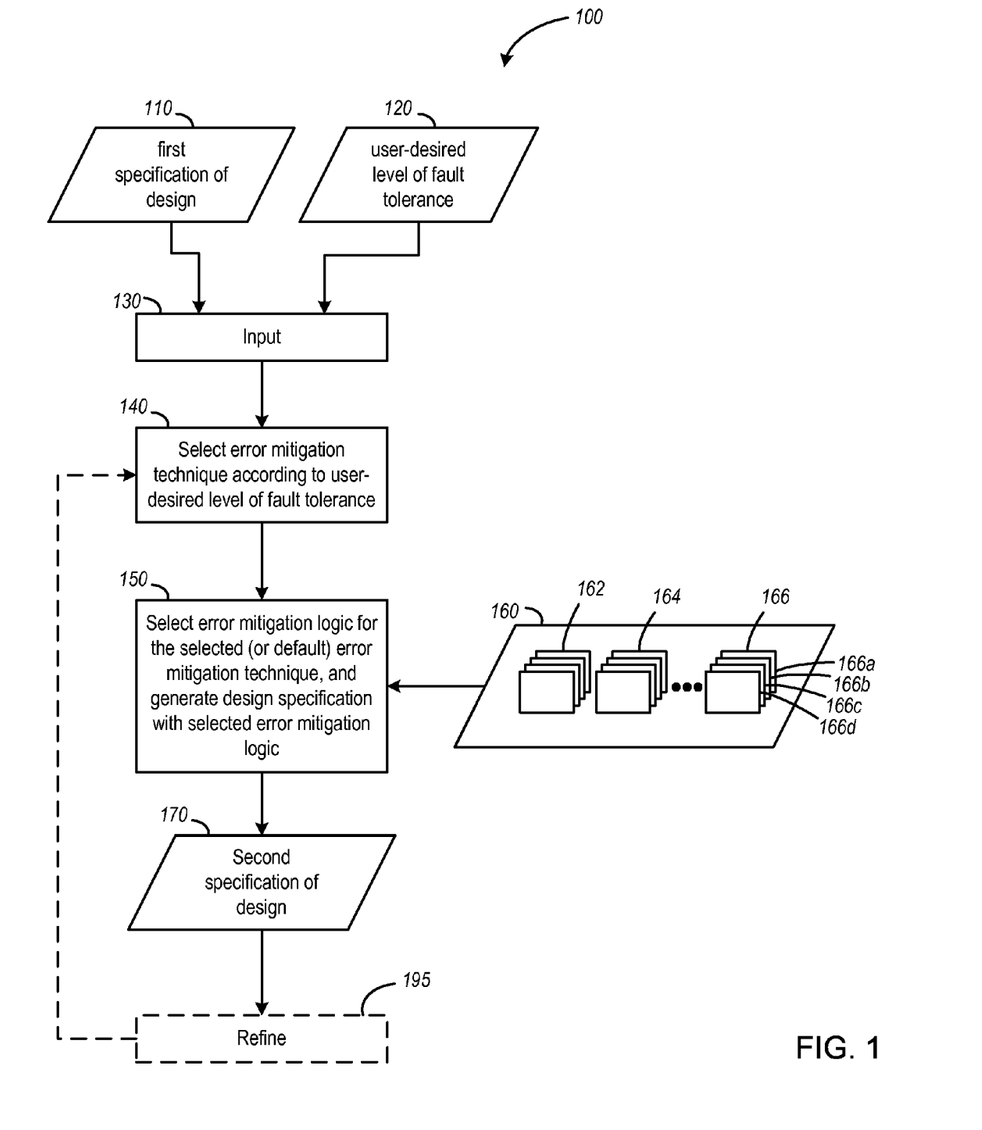
FIG. 1 is a flowchart describing steps performed in accordance with a first embodiment of the invention.

FIG. 1 is a flow chart 100 illustrating a method of generating an electronic system design in accordance with certain embodiments. A first specification 110 of the design is provided along with a user-defined level of fault tolerance 120 as inputs 130 for the selection 140 of error mitigation techniques. The first specification of the design may be provided in a high level programming language, in which case the user-defined level of fault tolerance may be provided in pragmas, or comments and documentation, within the high level language program. User input may additionally or alternatively be provided as a default setting, in response to queries, based on feedback from design performance under simulations, and so forth. Additionally or alternatively, the first specification of the design and user input may be generated in the form of user-selectable objects and attributes in a graphical user interface.

Referring again to FIG. 1, the inputs 130 are used to select 140 an error mitigation technique for various components of the system design based on the user-desired level of fault tolerance. The selected error mitigation technique for a particular component of the design is used to select and generate error mitigation logic 150 for that component in the design. The error mitigation logic may be selected from a library 160 of error mitigation logic modules. The library includes module sets 162, 164, 166. For example, each error mitigation logic module set, such as module set 166, may include modules that specify multiple levels of error mitigation logic, such as error mitigation modules 166a-166d, that are applicable to a given system component. Each of the error mitigation logic modules 166a-166d may embody a different one of the error mitigation techniques that are selectable in step 140, along with a circuit description for the given component. There may be one of the modules that includes no error mitigation.

The error mitigation logic selection and generation 150 is performed for each desired component of the system design. From the generated design specification that includes the selected error mitigation logic, a second specification of the system design is generated 170. The second specification is stored for later implementation in a hardware system, software system, or mixed hardware and software system, for example.

In certain embodiments, the system design based on the second specification may be tested, for example by simulating fault events, to determine whether the selected error mitigation logic is sufficient or otherwise appears to have the intended effect. Information from simulations and/or other testing is optionally used to refine selection of error mitigation logic, as indicated by the dashed arrow from step 195 to step 140 in FIG. 1. In this case, the method flow shown in FIG. 1 may be followed from step 140 using the original second specification as the new "first specification," and including information based on the testing results as user-specified data.

Figure 2:
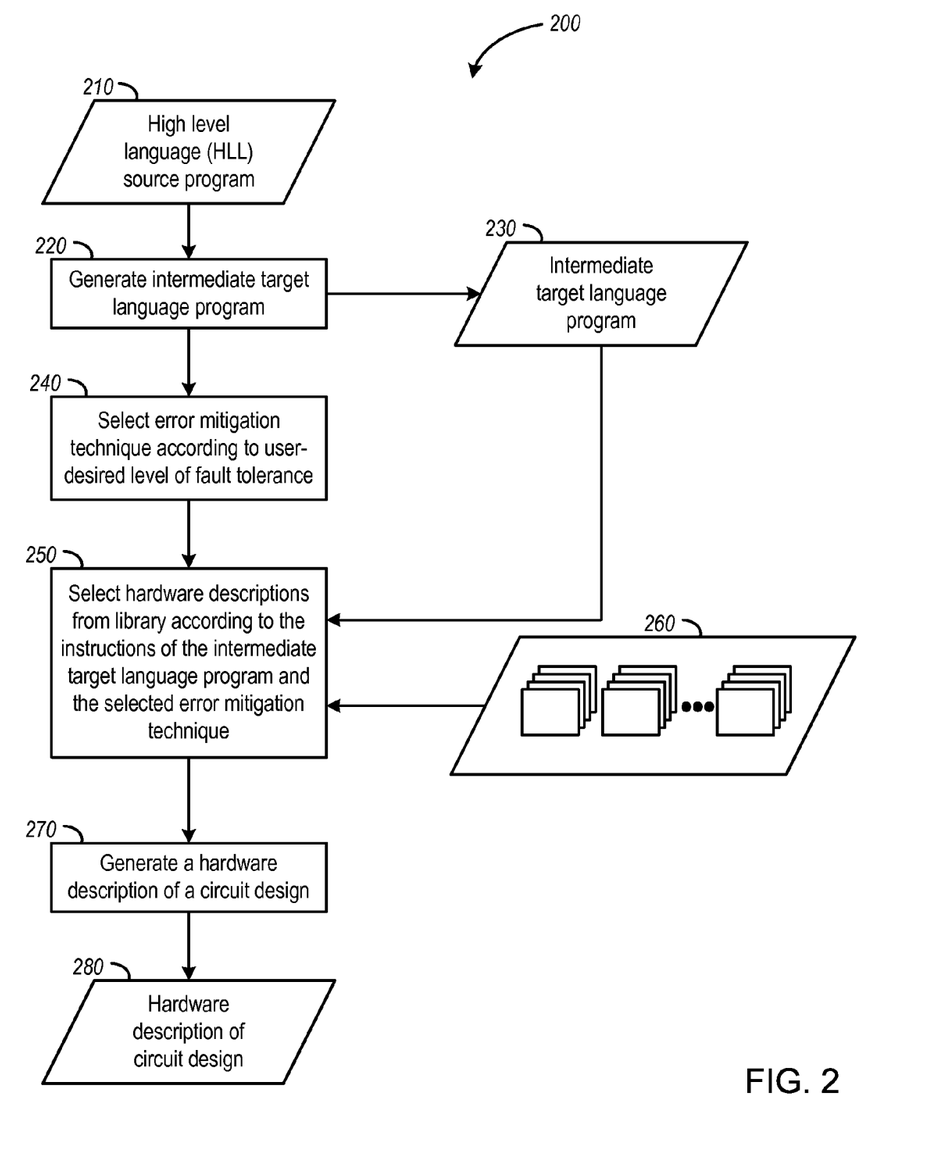
FIG. 2 is a flowchart describing steps performed in accordance with a second embodiment of the invention.

FIG. 2 is a flow chart 200 showing an implementation of a method such as illustrated by FIG. 1 in which the system design is first specified in a high level language (HLL) source program 210. The HLL program, generally, is an algorithmic representation of a circuit design that is to be generated from the HLL program, such as for a programmable logic device (PLD), for example an FPGA, or for an application specific integrated circuit (ASIC). In step 220, the HLL program is translated into an intermediate language program 230 such as CHiMPS, or another language having similar functionality, so that the various constructs of the HLL program can be identified and mapped to instructions having associated hardware descriptions.

Briefly, a CHiMPS compiler compiles a program, as specified in a standard or proprietary HLL such as C, C++, Fortran and many others known to those skilled in the art, into a CHiMPS language program. The CHiMPS language, as with conventional assembly languages, utilizes op-code mnemonics and operands. Within the CHiMPS language, instructions and pseudo-instructions are used. Generally, instructions may be used to generate a hardware specification, while pseudo-instructions provide information to the assembler. Instructions correspond to predefined hardware modules and operands of instructions correspond to FIFO buffers or registers. In other words, the instructions of the CHiMPS language representation typically are converted into instantiations of predefined hardware modules. The predefined hardware modules act on the operands, which are converted into FIFO buffers linking the hardware modules. The hardware implementation of a CHiMPS instruction generally waits for available data in the input FIFO buffer(s), then performs the operation and sends results to the output FIFO buffer(s), which provides input to the hardware implementation of the next instruction(s), thereby creating a pipeline. Further details of the CHiMPS tool flow may be found in U.S. Pat. No. 7,315, 991, to Bennett, which is referenced above.

Referring back to FIG. 2, in step 240, one or more error mitigation techniques are selected for the components of the circuit design in accordance with a user-desired level of fault tolerance. For example, the error mitigation technique(s) may be selected based on a default level of fault tolerance, which may be modified on a component-by-component basis from user input. The user input may be provided in any suitable manner such as from comments embedded in the program code (e.g., pragmas), from user data provided via a user interface, or from an associated input file.

In step 250, hardware descriptions are selected consistent with the error mitigation technique(s) selected in step 240 and based on the intermediate target language program 230 generated in step 220. The hardware descriptions are selected from a library 260, which includes a set of hardware description modules for each of the instructions in the intermediate target language program. Each module within a set specifies a different level of error mitigation logic. In step 270, an overall hardware description of the overall circuit design is generated from the selected hardware descriptions. The generated overall hardware description 280 includes the error mitigation logic as specified in the selected hardware descriptions and is stored for subsequent implementation in an appropriate hardware device. For example, the overall hardware description 280 can be translated into a netlist that specifies the logic structures and signals of the design and the netlist further processed into a bitstream for a programmable IC or chip design data for an ASIC.

Figure 3:
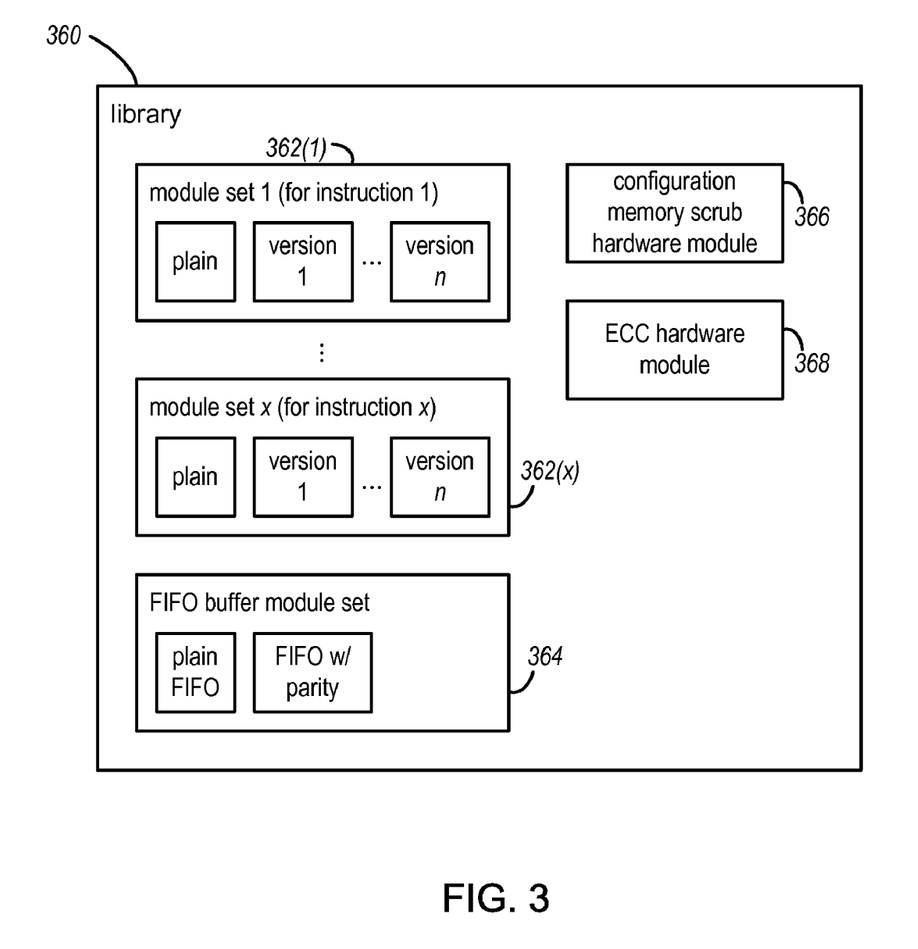
FIG. 3 illustrates a library of error mitigation logic modules for use in accordance with an embodiment of the invention.

FIG. 3 illustrates an example library 360 that includes error mitigation logic modules for each electronic system component or instruction provided in the first description of the system design. For example, separate module sets 362(1) through 362(x) are provided in the library 360 for each of x distinct instructions or components. Each of the module sets 362(1) through 362(x) includes error mitigation logic circuit descriptions for each of the selectable error mitigation techniques. For example, module set 362(1) includes a circuit description for no error mitigation, designated as plain, and separate logic circuit descriptions for each level of added error mitigation, designated version 1 through version n. Additionally, the library 360 may include modules that are generally applicable to the system design and not to any particular component. For example, there may be a FIFO buffer module set 364 that includes a circuit description for a plain FIFO buffer and a circuit description for a FIFO buffer with parity bit checking. Error mitigation logic may be selected globally for all FIFO buffers or on an individual FIFO buffer basis. As another example of generally applicable modules, library 360 may also include error mitigation logic circuit descriptions 366 and 368 for configuration memory scrub hardware and for processing error correction code (ECC) bits in an external memory, respectively.

Error mitigation techniques selectable in accordance with embodiments of the present invention include any desired error mitigation technique. General categories of error mitigation techniques include those that are highly fault tolerant, such as triple modular redundant (TMR) circuits or double modular redundant (DMR) circuits, and those that are less fault tolerant, such as configuration memory scrubbing logic, parity bit checking, and application-aware fault tolerance. Each of these techniques is briefly described in the following paragraphs.

TMR circuits involve triplicating the target circuitry, typically at the cost of significant area overhead. Likewise, DMR circuits involve duplicating the target circuitry, which uses less area than TMR but at a lower level of fault tolerance. In the case of system design specification generated from an HLL, CHiMPS tools may be used to automatically build TMR and DMR circuits. As discussed, CHiMPS compiles HLL into intermediate CHiMPS Target Language (CTL) instructions. Each non-pseudo CTL instruction has a corresponding hardware block associated with it, and the library of error mitigation logic modules can include various CTL instructions used to instantiate hardware blocks having the selected TMR or DMR circuitry. These hardware blocks are connected using FIFOs, which can also be built with triple or double modular redundancy. The CHiMPS tools thus use the library of TMR or DMR instructions and FIFOs to generate a fault tolerant circuit from HLL programs.

In addition or as an alternative to using TMR or DMR instructions, a scrubbing circuit can be instantiated to identify a change in configuration state and can fix the bit flips, for example, that may be caused by high radiation environments. The purpose of a scrubbing circuit is to detect and fix a bit flip in configuration memory space. Such circuitry may be automatically instantiated by CHiMPS tools when a lesser fault tolerant approach is preferred by the user.

For electronic systems in which data is passed through FIFO buffers, error mitigation logic can be selectively built into the FIFO buffers so that one or more parity bits are associated with the data. A given piece of data that is pushed into a FIFO buffer is required to be identical when it is pulled from that FIFO buffer at a later time. As such, one or more known parity (or data-correcting) bits can be added into the FIFO buffer as data is inserted so that when the data is removed, the bits are used to guarantee that the value is correct. Such an error mitigation technique can at least be used to help prevent the propagation of errors, even if the errors themselves are not prevented.

In addition to FIFO buffers that pass data internally to the circuit, data may be read from or written to external (e.g., off-chip) memory. As such, hardware description of error mitigation circuitry may be selectively added to appropriately read and write ECC bits when data is being transferred from and to an external memory. For example, the external memory may be preprocessed to add ECC bits upon startup (or as that data is copied to the chip-accessible memory, for an on-chip electronic system). A hardware description for each instruction to read and write external memory can be instantiated to use these ECC bits, if desired. The hardware description for an instruction that returns memory data back to a calling application will specify removal of the ECC bits from the data returned to the calling application.

In addition to the error mitigation techniques discussed above, there may be applications that have a certain degree of error tolerance due to the nature of the application. For example, an application for processing data and outputting an image may be able to tolerate some errors at a fine level of image detail so long as the overall image is accurate. As such, if an error produces an incorrect pixel, the final result is still likely to be acceptable. To this extent, the application may be considered tolerant of certain (sufficiently small) errors for a sufficiently small window of time. For such applications, a scrubbing circuit may be instantiated to check for any bit flips. Fixing the bit flips may be delayed in the case that the error is non-accumulative.

In accordance with certain embodiments of the present invention, the user can select from among a variety of error mitigation techniques for each component or instruction. One choice may be to allow the error mitigation technique to be automatically selected, for example in accordance with a default setting. In other instances, automatic selection of error mitigation technique may be based on information related to the electronic system and/or intended environment, which may be provided by the user. In one example, a user may provide parameters that can be used to compute the mean time between failures (MTBF), or may provide the MTBF directly. The tool may be pre-programmed with different MTBF thresholds or ranges, each associated with a different error mitigation technique. The user may also provide information related to the error tolerance of the application along with the nature of the errors (e.g., cumulative versus non-cumulative). Generally, higher MTBFs would be associated with less robust error mitigation techniques. The tool may also allow a user to over-ride the automatic selection.

In addition to selecting error mitigation techniques, automatic generation of error mitigation logic in accordance with aspects of the present invention may include selection of whether and when to fix detected errors. For example, it may be desirable to fix upset bits in a manner that avoids interrupting the circuit operation. In particular, it may be observed that only a small percentage of the total configuration bits are used by a circuit on a FPGA. These bits may be called "care" bits. If the upset bit is not a care bit, fixing of the bit can be delayed to allow the application to execute uninterrupted. Selection of how to handle bit fixing may be done automatically, for example by default condition or user input parameters, or may be done directly by the user.

Figure 4:
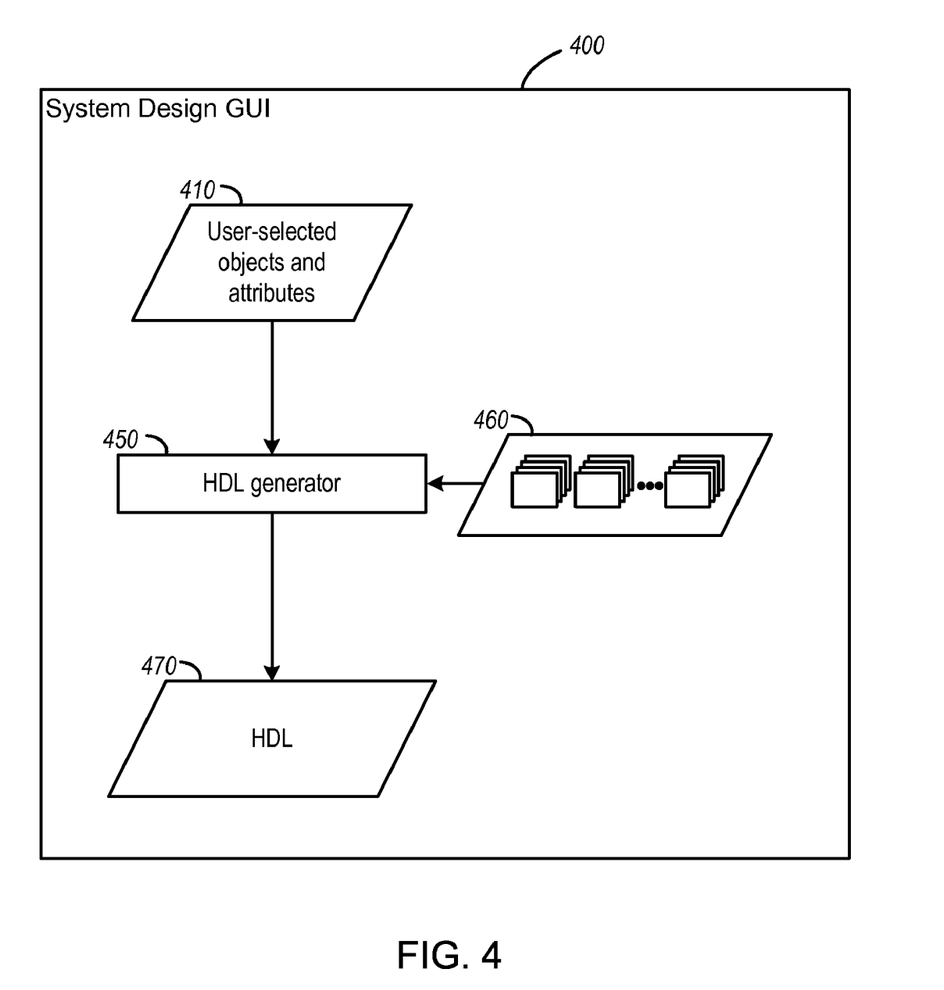
FIG. 4 is a flowchart describing steps performed in accordance with a third embodiment of the invention.

FIG. 4 is a flow chart showing an implementation of a method such as illustrated by FIG. 1 in which the system design is specified with the aid of a graphical user interface (GUI) tool 400. The GUI tool allows a user to specify the electronic system by selecting and dragging objects into a design window (not shown) and further specifying the attributes of and connections between those objects. In accordance with aspects of the present invention, the selectable object and attributes include a variety of error mitigation techniques for each system component. The user-selected objects and attributes 410 may be provided to an HDL generator 450 that generates code specifying the system design. The HDL generation step 450 may utilize a library 460 of error mitigation logic such as described above. The output of the GUI system is a specification of the design in HDL 470 that can be stored for further processing into a hardware implementation.

Figure 5:
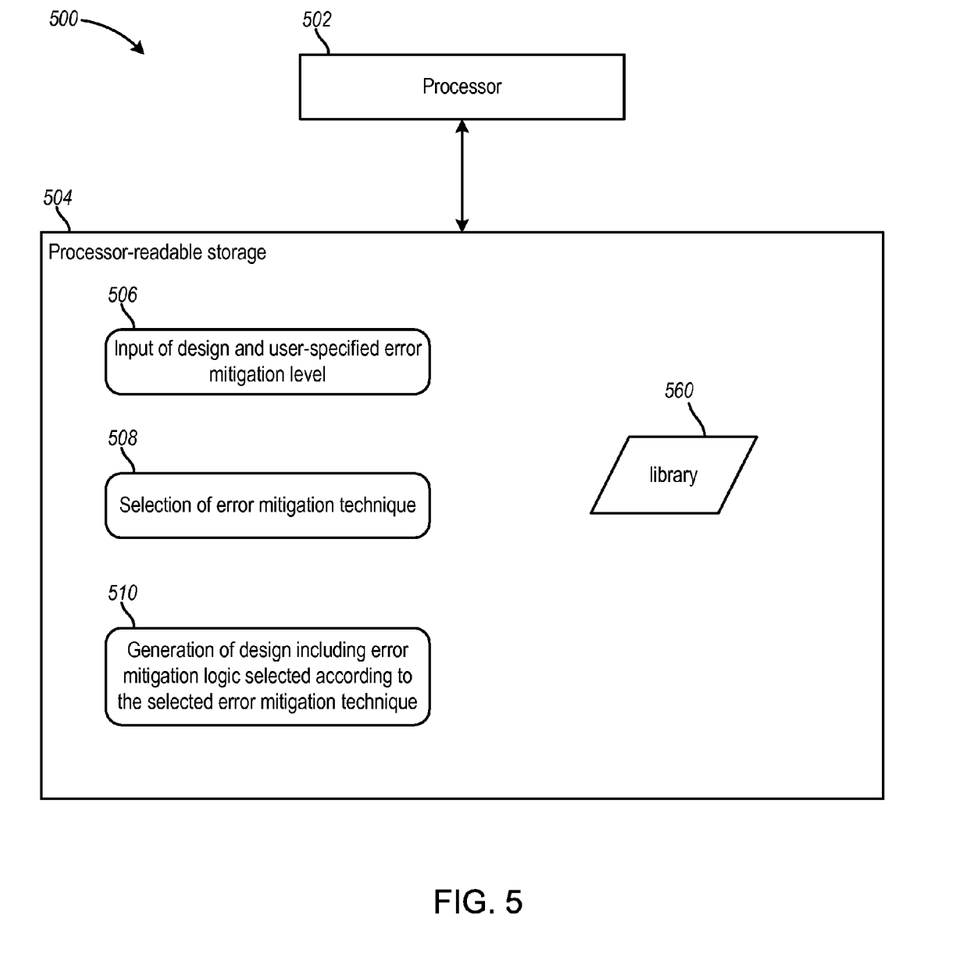
FIG. 5 schematically shows a system for performing methods in accordance with an embodiment of the invention.

FIG. 5 shows a tool 500 for performing aspects of the present invention. The tool includes a processor 502 for performing the steps, as well as processor-readable storage 504 having stored thereon instructions and information executed and used by the processor 502 in performance of the steps. The processor-readable storage 504 includes instructions 506 for inputting the initial design specification, as well as user-specified data for selecting error mitigation level. The processor-readable storage 504 includes instructions 508 for selecting an error mitigation technique for the system components or intermediate language instructions. The processor-readable storage 504 further includes instructions 510 for generating and storing a second specification of the design, which includes error mitigation logic selected for each component according to the selected error mitigation technique. The error mitigation logic may be selected from a library 560, which is also part of the processor-readable storage 504.

Those skilled in the art will appreciate that various alternative computing arrangements, including one or more processors and a memory arrangement configured with program code, would be suitable for hosting the processes and storing the data structures of the different embodiments of the present invention. In addition, the processes may be provided via a variety of computer-readable storage media or delivery channels such as magnetic or optical disks or tapes, electronic storage devices, or as application services over a network.

The present invention is thought to be applicable to a variety of systems for creating combined hardware and software systems. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method for generating a design of an electronic system, the method comprising:
   for each of one or more components of a first specification of the design, selecting an error mitigation technique from among multiple different error mitigation techniques in response to user-specified data associated with the first specification of the design;
   wherein the first specification of the design comprises a program written in a high-level programming language (HLL), and the user-specified data comprises a portion of the program;
   automatically generating a second specification of the design from the first specification, the second specification including error mitigation logic corresponding to each selected error mitigation technique for each of the one or more components; and
   storing the second specification of the design;
   wherein the selecting, automatically generating, and storing are performed by a processor.

2. The method of claim 1, further comprising selecting the error mitigation logic from a library of error mitigation logic that includes error mitigation logic for each of the multiple different error mitigation techniques.

3. The method of claim 2, wherein the generating of the second specification comprises:
   translating the first specification to a program in an intermediate programming language having a plurality of instructions, wherein the library includes a respective hardware module for each different one of the instructions, and each hardware module includes a respective version for each of two or more of the error mitigation techniques; and
   generating the second specification to include versions of the hardware modules that correspond to the plurality of intermediate programming language instructions in the program for the selected error mitigation technique.

4. The method of claim 3, wherein:
   the library includes at least two respective versions of first-in-first-out (FIFO) hardware modules for each of two or more of the error mitigation techniques; and
   the generating the second specification includes generating the second specification to include one of the versions of the FIFO hardware modules corresponding to the selected error mitigation technique for input of operand values to and output of operand values from the instructions of the program in an intermediate programming language.

5. The method of claim 1, wherein the user-specified data includes information related to a desired fault tolerance level for specified components of the design.

6. The method of claim 5, wherein a default fault tolerance level is used for unspecified components of the design.

7. The method of claim 1, wherein the user-specified data is provided on a component-by-component basis.

8. The method of claim 1, wherein the user-specified data is determined based on feedback from simulation of the design.

9. The method of claim 1, wherein the plurality of error mitigation techniques correspond to different degrees of fault tolerance.

10. The method of claim 9, wherein the error mitigation logic corresponding to the different degrees of fault tolerance includes one or more of triple modular redundant (TMR)

logic, dual modular redundant (DMR) logic, scrubbing logic, time redundancy, and parity checking logic.

11. The method of claim 1, wherein in response to a first value of a data element of the user-specified data, the error mitigation logic is specified to fix an errant bit in the electronic system, and in response to a second value of the data element, the error mitigation logic is not specified to fix an errant bit in the electronic system.

12. The method of claim 1, wherein the selecting and the generating are performed when compiling the HLL to a target language.

13. The method of claim 1, wherein at least some of the user-specified data is provided in pragmas in the first specification.

14. The method of claim 1, further comprising inputting the first specification and user-specified data via a graphical user interface (GUI).

15. The method of claim 1, wherein the second specification of the design comprises a circuit specification for the electronic system.

16. The method of claim 1, wherein the second specification of the design comprises a computer program specification for executing in the electronic system.

17. An article of manufacture, comprising:
  a processor-readable storage device storing instructions that when executed by one or more processors cause the one or more processors to generate a design of an electronic system by performing the operations including,
    for each of one or more components of a first specification of the design, selecting an error mitigation technique from among multiple different error mitigation techniques in response to user-specified data associated with the first specification of the design;
    wherein the first specification of the design comprises a program written in a high-level programming language (HLL), and the user-specified data comprises a portion of the program;
    automatically generating a second specification of the design from the first specification, the second specification including error mitigation logic corresponding to each selected error mitigation technique for each of the one or more components; and
    storing the second specification of the design.

18. A system for generating a design of an electronic system, comprising:
  a processor; and
  a storage medium coupled to the processor and configured with instructions that when executed by the processor cause the processor to perform the operations including,
    for each of one or more components of a first specification of the design, selecting an error mitigation technique from among multiple different error mitigation techniques in response to user-specified data associated with the first specification of the design;
    wherein the first specification of the design comprises a program written in a high-level programming language (HLL), and the user-specified data comprises a portion of the program;
    automatically generating a second specification of the design from the first specification, the second specification including error mitigation logic corresponding to each selected error mitigation technique for each of the one or more components; and
    storing the second specification of the design.

* * * * *